(12) United States Patent
Liu et al.

(10) Patent No.: US 9,299,671 B2
(45) Date of Patent: Mar. 29, 2016

(54) INTEGRATED CMOS BACK CAVITY ACOUSTIC TRANSDUCER AND THE METHOD OF PRODUCING THE SAME

(71) Applicant: Invensense, Inc., San Jose, CA (US)

(72) Inventors: Fang Liu, San Jose, CA (US); Michael Julian Daneman, Campbell, CA (US); Brian Kim, Fremont, CA (US); Anthony Minervini, Palos Hills, IL (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/054,495

(22) Filed: Oct. 15, 2013

(65) Prior Publication Data

US 2015/0102390 A1    Apr. 16, 2015

(51) Int. Cl.
| | |
|---|---|
| *B81B 3/00* | (2006.01) |
| *B81C 1/00* | (2006.01) |
| *H01L 29/00* | (2006.01) |
| *H01L 21/00* | (2006.01) |
| *H04R 19/04* | (2006.01) |
| *H01L 29/84* | (2006.01) |
| *H01L 23/00* | (2006.01) |
| *H01L 27/092* | (2006.01) |
| *H04R 19/00* | (2006.01) |

(52) U.S. Cl.
CPC ............ *H01L 24/05* (2013.01); *B81C 1/00309* (2013.01); *H01L 27/092* (2013.01); *H04R 19/005* (2013.01); *B81B 3/0018* (2013.01); *B81B 2201/0257* (2013.01); *B81C 2203/0792* (2013.01); *H01L 2924/01322* (2013.01); *H01L 2924/12042* (2013.01)

(58) Field of Classification Search
CPC ...... H04R 19/005; H04R 19/04; H04R 1/086; H04R 2410/00; H04R 2499/11; H04R 9/08; B81C 1/00246; B81C 1/00158; B81C 2203/0714; B81C 1/00134; B81C 1/0023; B81C 2203/0145; B81C 2203/0735; B81C 1/00333; B81C 2203/0109
See application file for complete search history.

(56) References Cited

U.S. PATENT DOCUMENTS

| | | | |
|---|---|---|---|
| 8,350,346 B1* | 1/2013 | Huang | B81B 3/0051 257/414 |
| 8,421,168 B2* | 4/2013 | Allen et al. | 257/416 |
| 8,542,850 B2* | 9/2013 | Wang et al. | 381/175 |
| 8,659,100 B2* | 2/2014 | Zoellin | H04R 19/005 257/418 |
| 2009/0101998 A1* | 4/2009 | Yen et al. | 257/416 |

(Continued)

OTHER PUBLICATIONS

Chien-Hsin Huang et al: "Design and implementation of a novel CMOS MEMS condenser microphone with corrugated diaphragm"; 2011 16th International Solid-State Sensors, Actuators and Microsystems Conference (Transducers 2011) : Beijing, China, Jun. 5-9, 2011, IEEE, Piscataway, NJ, Jun. 5, 2011, pp. 1026-1029.

*Primary Examiner* — Howard Weiss
*Assistant Examiner* — Nelson Garces
(74) *Attorney, Agent, or Firm* — Maryam Imam; IPxLAW Group LLP

(57) ABSTRACT

A MEMS device includes a MEMS substrate with a movable element. Further included is a CMOS substrate with a cavity, the MEMS substrate disposed on top of the CMOS substrate. Additionally, a back cavity is connected to the CMOS substrate, the back cavity being formed at least partially by the cavity in the CMOS substrate and the movable element being acoustically coupled to the back cavity.

27 Claims, 15 Drawing Sheets

(56) References Cited

U.S. PATENT DOCUMENTS

| | | | |
|---|---|---|---|
| 2010/0052082 A1* | 3/2010 | Lee et al. ...................... | 257/416 |
| 2010/0273286 A1 | 10/2010 | Liang et al. | |
| 2010/0284553 A1* | 11/2010 | Conti et al. ................... | 381/174 |
| 2013/0161702 A1* | 6/2013 | Chen ................... | B81C 1/00246 |
| | | | 257/254 |
| 2013/0221457 A1* | 8/2013 | Conti ................... | B81B 7/0061 |
| | | | 257/416 |

* cited by examiner

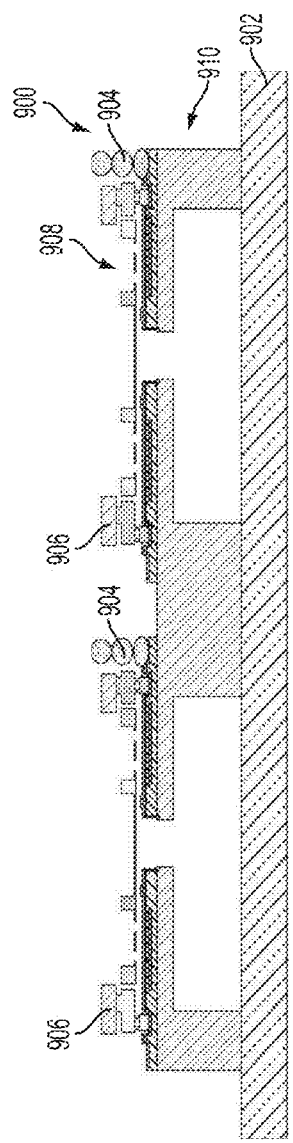
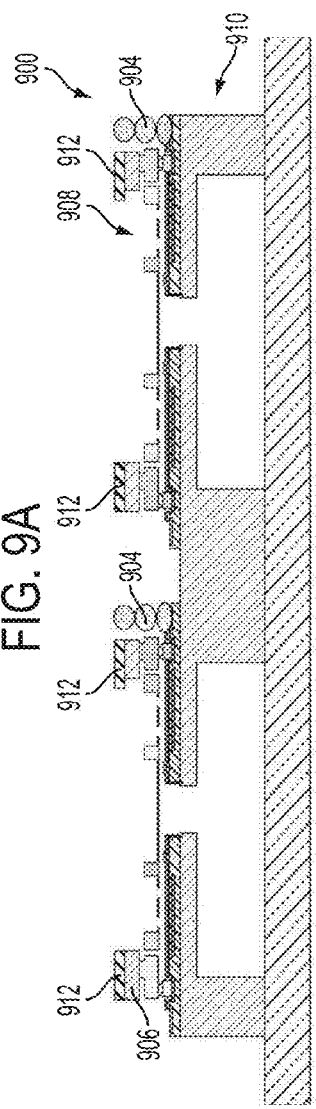
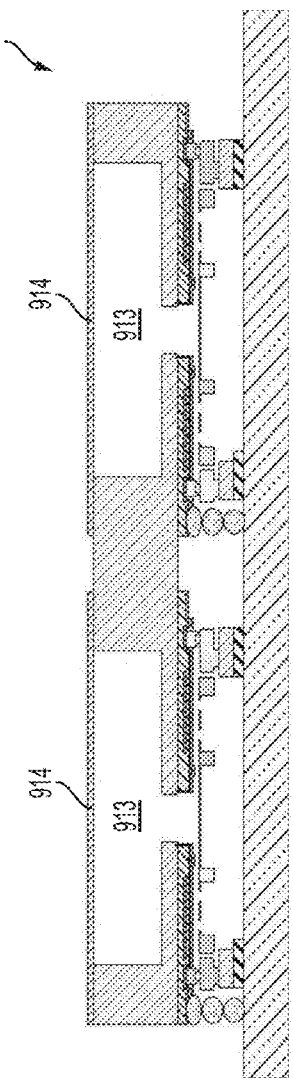
FIG. 9A
FIG. 9B
FIG. 9C

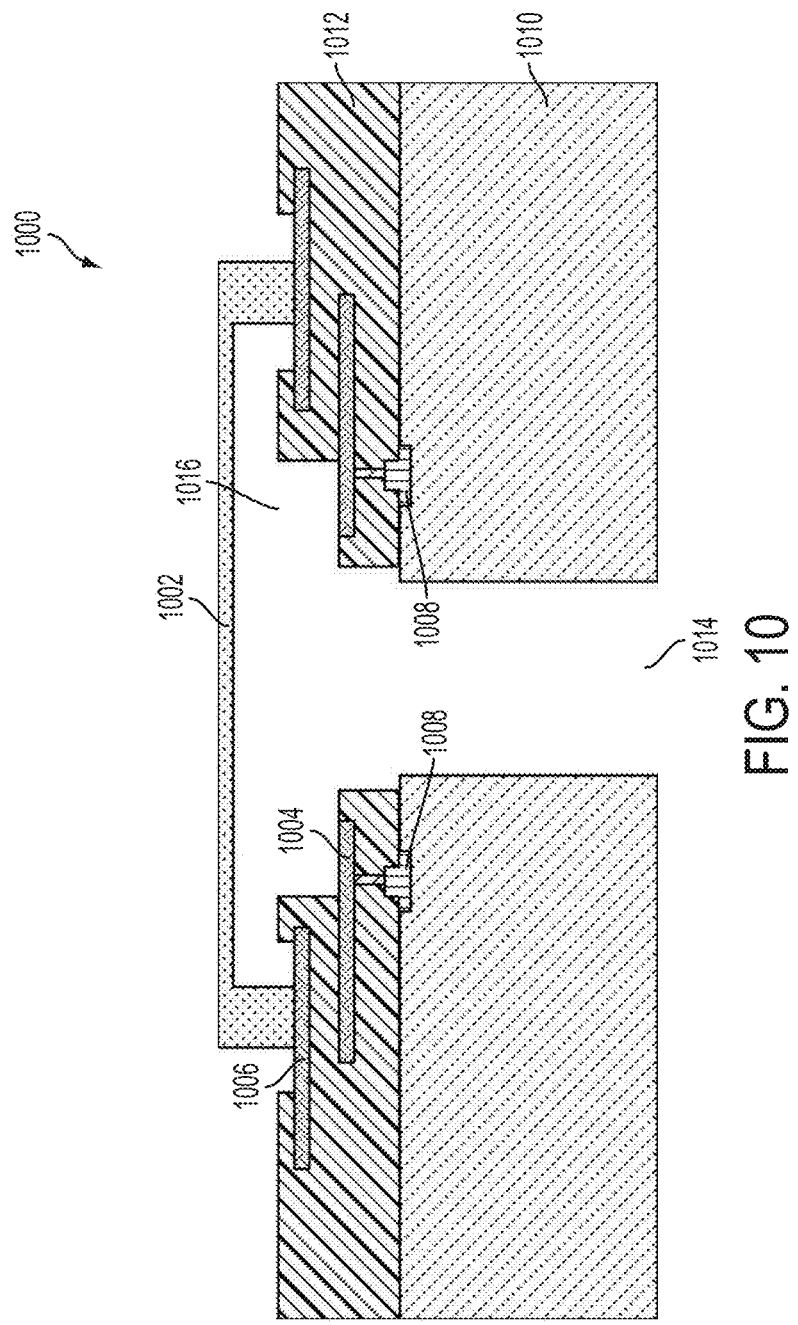

US 9,299,671 B2

INTEGRATED CMOS BACK CAVITY ACOUSTIC TRANSDUCER AND THE METHOD OF PRODUCING THE SAME

BACKGROUND

Various embodiments of the invention relate generally to a MEMS device and particularly to a method for manufacturing the same.

MEMS devices in the form of acoustic transducers such as microphones and Micromachined Ultrasonic Transducers (MUTs) integrated with CMOS, are typically packaged in external cavity packages, which are much larger than the die and therefore occupy a large footprint on a circuit board. It is desirable to create a chip scale packaged (CSP) acoustic sensors with an integrated back cavity (IBC), however conventional CSP methods such a Through Silicon Via (TSV) are generally not compatible with acoustic sensor fabrication processes. Accordingly, a conventional CSP cannot be employed and the footprint of the packaging is undesirably large.

What is desired is a small-footprint acoustic device without comprising performance.

SUMMARY

Briefly, a MEMS device includes a MEMS substrate with a movable element. Further included is a CMOS substrate with a cavity, the MEMS substrate is disposed on top of the CMOS substrate. Additionally, a back cavity is connected to the CMOS substrate, the back cavity being formed at least partially by the cavity in the CMOS substrate and the movable element being acoustically coupled to the back cavity.

A further understanding of the nature and the advantages of particular embodiments disclosed herein may be realized by reference of the remaining portions of the specification and the attached drawings.

BRIEF DESCRIPTION OF THE DRAWINGS

FIGS. 9(a)-9(j) show the manufacturing process, in accordance with the flow chart of FIG. 8, in fabricating a MEMS device with RF shielding and inner seal, in accordance with a method and embodiment of the invention.

FIG. 10 shows a MEMS device 1000, in accordance with another embodiment of the invention.

DETAILED DESCRIPTION OF EMBODIMENTS

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors, microphones, and radio-frequency components. Silicon wafers containing MEMS structures are referred to as MEMS wafers.

In the described embodiments, MEMS device may refer to a semiconductor device implemented as a micro-electro-mechanical system. MEMS structure may refer to any feature that may be part of a larger MEMS device. An engineered silicon-on-insulator (ESDI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space. Post may be a vertical structure in the cavity of the MEMS device for mechanical support. Standoff may be a vertical structure providing electrical contact.

In the described embodiments, back cavity may refer to a partial enclosed cavity equalized to ambient pressure via Pressure Equalization Channels (PEC). In some embodiments, back cavity is also referred to as back chamber. A back cavity formed within the CMOS-MEMS device can be referred to as integrated back cavity. Pressure equalization channel, also referred to as leakage channels/paths, are acoustic channels for low frequency or static pressure equalization of back cavity to ambient pressure.

In the described embodiments, a rigid structure within a MEMS device that moves when subject to force may be referred to as a plate. A back plate may be a perforated plate used as an electrode.

In the described embodiments, perforations refer to acoustic openings for reducing air damping in moving plates. Acoustic port (or "port") may be an opening for sensing the acoustic pressure. Acoustic barrier may be a structure that prevents or delays acoustic pressure from reaching certain portions of the device. Linkage is a structure that provides compliant attachment to substrate through anchor. In plane bump stops are extensions of the plate which come in contact with the device seal to limit range of movement in the plane of the plate. Rotational bump stop are extensions of the plate to limit range of rotations.

Figure 1:
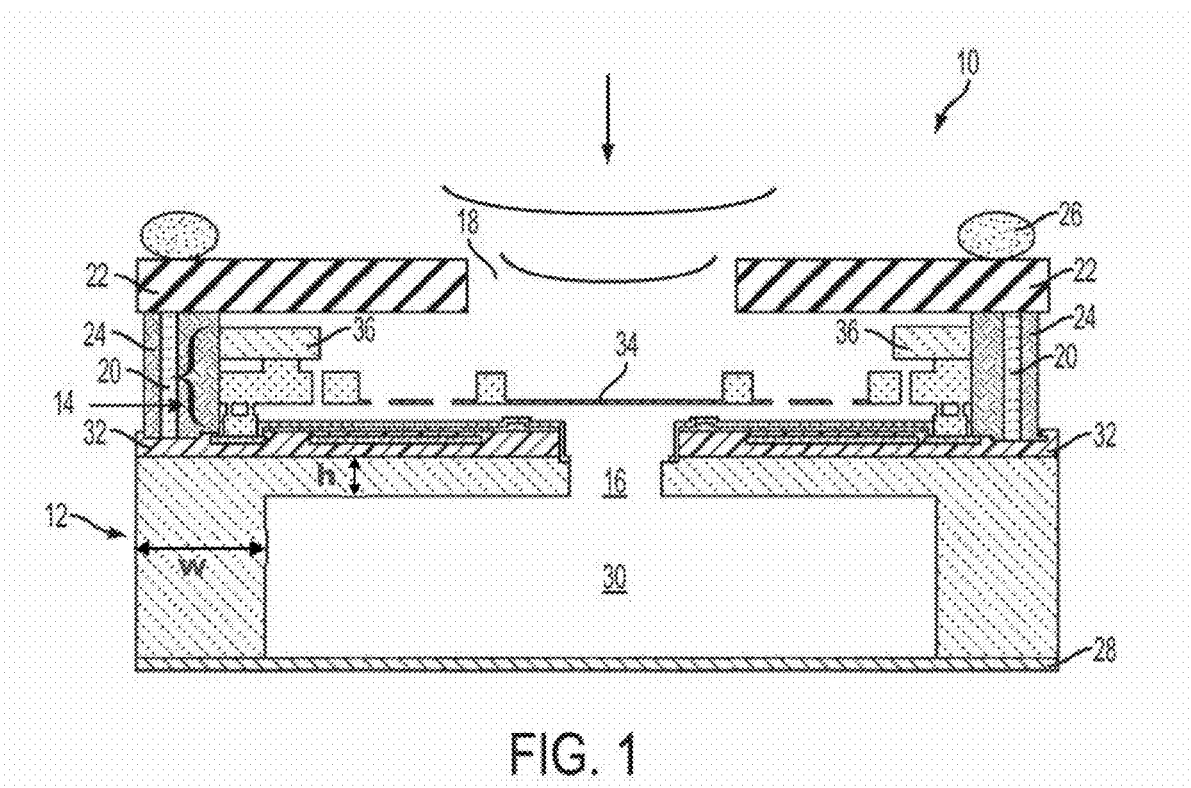
FIG. 1 shows a MEMS device, in accordance with an embodiment of the invention.

Referring now to FIG. 1, a MEMS device 10 is shown, in accordance with an embodiment of the invention. The MEMS device 10 is shown to include a CMOS substrate 12 bonded to a MEMS substrate 14. In an embodiment of the invention, the MEMS device 10 is a microphone and in another embodiment of the invention, the MEMS device 10 is an acoustic transducer such as MUTs. In the case of a microphone, the MEMS device 10 may be a membrane type of microphone, a piston type of microphone, or a torsional type of microphone. Further, in accordance with a method of the invention, the CMOS substrate 12 is bonded to the MEMS substrate 14 using Eutectic bonding although other suitable bonding methods are contemplated.

The CMOS substrate is shown to be covered by a cap layer 28 at a surface opposite to a surface that is bonded with the CMOS substrate 12. Further included in the MEMS device 10, is a CMOS back cavity 30 that is connected to the MEMS substrate 14 through a cavity (or "port") 16. The cap layer 28 covers the back cavity 30. In an embodiment of the invention, the cap layer 28 is made of conductive material, such as metal and is referred to herein as a "metal cover". In other embodiments, the cap layer 28 is made of non-conductive material that may include conductive material. The MEMS substrate 14 includes a movable element 34 that moves in response to acoustic waves received from the acoustic port 18 in the substrate 22.

The back cavity 30 is connected to the CMOS substrate 12 and formed at least partially by a cavity in the CMOS substrate 12. The movable element 34 is acoustically coupled to the back cavity 30.

Stud bumps 20 are shown disposed between the CMOS substrate 12 and a carrier substrate 22. More specifically, they are disposed on the metal pads 32 of the CMOS substrate 12 accordingly electrically connecting the CMOS substrate 12 to the carrier substrate 22.

Further shown in FIG. 1 is an optional underfill 24 disposed between the CMOS substrate 12 and the carrier substrate 22. Solder balls (or "solder metal") 26 are shown optionally formed on top of the carrier substrate 22.

In some embodiments, the carrier substrate 22 is made of laminate or ceramic. In an embodiment of the invention, the stud bumps 20 are formed inside the underfill 24. In some embodiments of the invention, the stud bumps 20 are made of gold. In other embodiments, the stud bumps are made of any conductive material such as lead and tin. In still other embodiments of the invention, the stud bumps 20 are multiple stud bumps disposed on top of each other. In some embodiments of the invention, the stud bumps are formed using a ball bonder.

The MEMS movable element 34 is effectively formed on top of the CMOS substrate 12. The back cavity 30 is etched in the CMOS substrate 12 to enlarge the back cavity volume. The thickness of the remaining portion of the CMOS substrate 12 is marked, in FIG. 1, by "h" and in an embodiment of the invention is approximately 20-100 micro meters (um). The width of the side wall of the back cavity 30, marked by "w", in FIG. 1, is approximately 20-200 um, in an exemplary embodiment of the invention. In an exemplary embodiment, the volume of back cavity 30 is maximized while still maintaining a reasonable structural integrity for the device. Accordingly, performance of the MEMS device 10, particularly in embodiments such as a microphone, is improved while its footprint remains small.

The cap layer 28 is connected to the CMOS substrate 12 by an epoxy (conductive or non-conductive), metal paste, or solder. The CSP package is realized by connecting the bond pads 32 on the CMOS substrate 12 to the substrate 22 by the stud bumps 20. The edge of the die is sealed with the underfill 24. In an exemplary embodiment, the underfill 24 is made of epoxy or silicone. The substrate 22 is electrically connected to the stud bumps 20 by thermal or thermo-sonic compression bonding or another conductive bonding method.

Applications of the various embodiments and methods shown and described herein include but are not limited to microphones, pressure sensors, resonators, switches, and other applicable devices.

As will become further evident in the discussion and figures to follow, a two-step etching process is employed to create the back cavity 30. In one embodiment, the port 16 and back cavity 30 are formed by separate etching steps. In another embodiment, the port 16 is partially etched in a first etching step, with the second etching step forming the back cavity 30 and completing the etch of port 16. In an exemplary embodiment, the back cavity 30 is approximately 100 um to 2 millimeters (mm). Further, the back cavity 30 may be of any shape, including square-shaped or round-shaped. Further shown in FIG. 1, is a handle wafer 36 which is optionally employed. The handle wafer 36 is shown disposed below the substrate 22.

Figure 2:
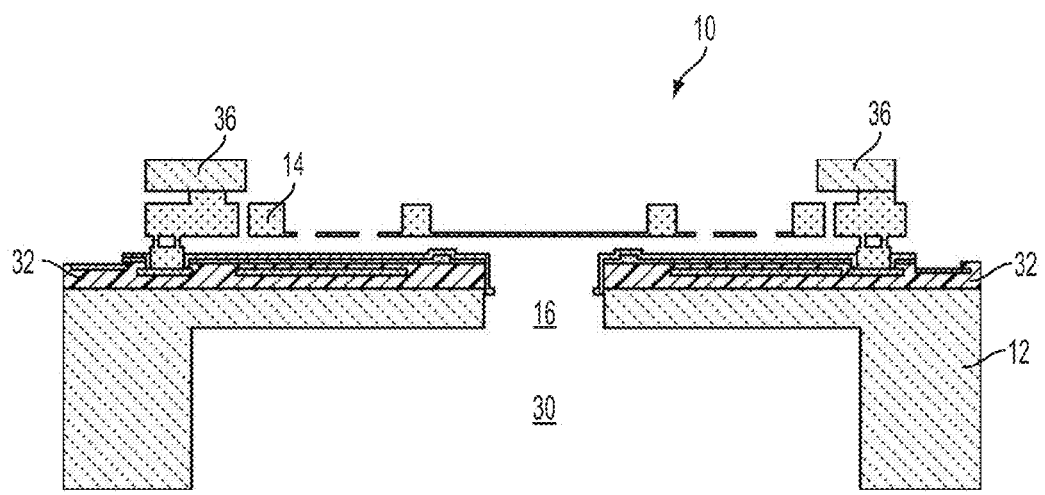
FIG. 2 shows the MEMS device 10 before it is packaged

FIG. 2 shows the MEMS device 10 before it is packaged. As previously noted, the handle wafer 36 is optional. The handle wafer 36 can act as a spacer when mounting to a carrier substrate and may also be used as an over-travel stop for the movable element 34 In an exemplary embodiment, the handle wafer 36 is made of silicon and is approximately 10 um to 200 um thick.

Figure 3:
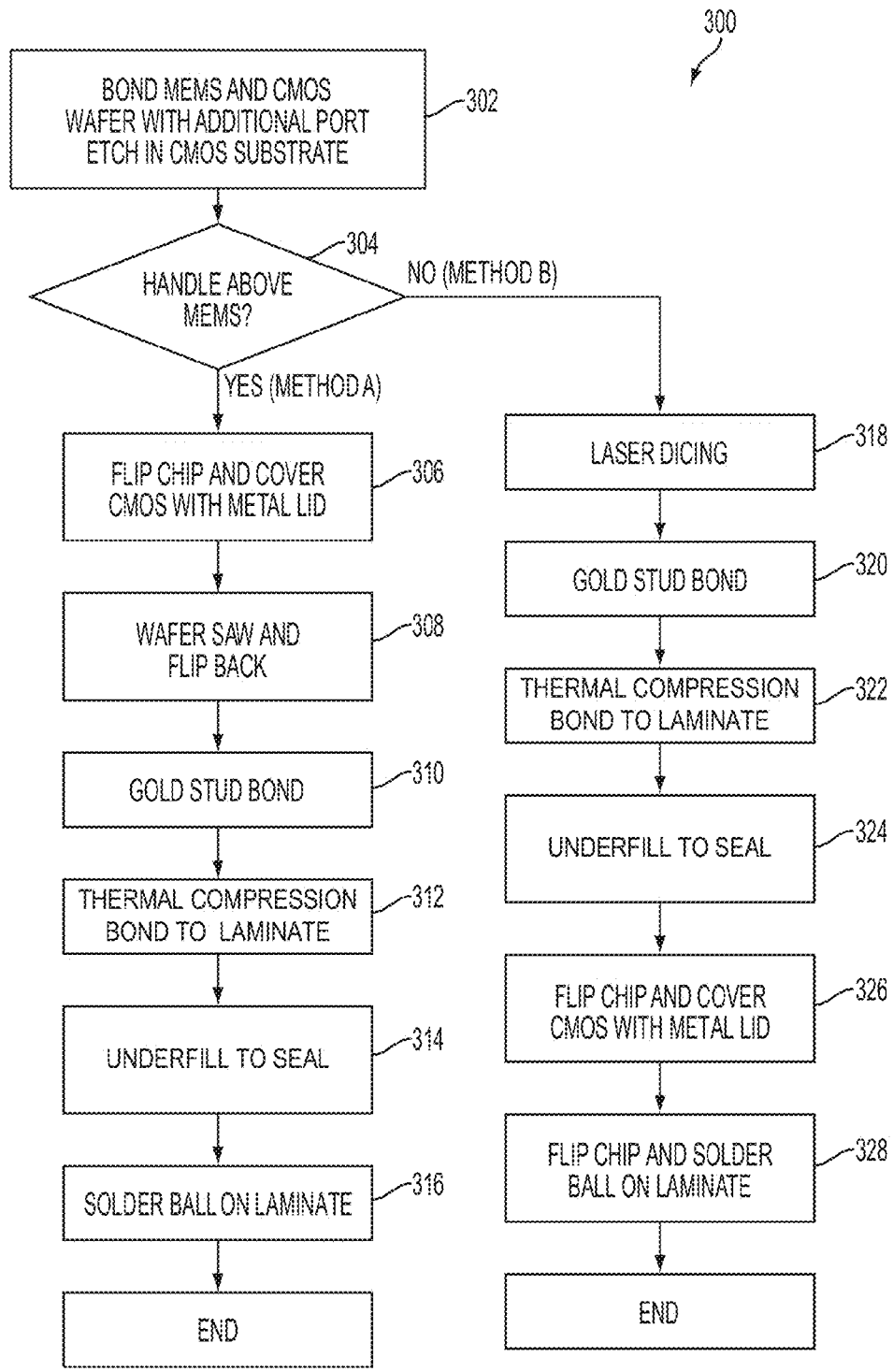
FIG. 3 shows a process flow 300 for fabricating the MEMS device 10, in accordance with a method of the invention.

FIG. 3 shows a process flow 300 for fabricating the MEMS device 10, in accordance with a method of the invention. In FIG. 3, at step 302, the MEMS substrate 14 is bonded to the CMOS substrate 12 with the additional port 16 etched in the CMOS substrate 12. Next, at 304, depending on whether or not the MEMS device 10 includes the handle wafer 36 or not, the steps 306 or 318 are performed. In the case where the handle wafer 36 is used, the process continues to step 306 and where no handle wafer is used, the process continues to the step 318.

At step 306, the chip is flipped and the cap layer 28 is disposed to cover the CMOS substrate 12 and the back cavity 30. Next, at step 308, wafer saw is performed and the chip is flipped back. In an alternative embodiment, laser dicing is used rather than wet wafer sawing to singulate wafer into die.

Next, at step 310, stud bumps 20 are bonded to the CMOS substrate 12. It is noted that the steps 310 and 308 can be reversed with the step 310 being performed before the step 308.

Next, at step 312, the die are bonded to a carrier substrate via the stud bumps 20 using a thermal or thermo-sonic compression bond. Followed by step 314 where underfill is disposed to seal the edges of the MEMS substrate 14. It is noted that steps 312 and 314 may be reversed if the underfill is cured to a "B-stage" prior to the compression bond.

In the alternate embodiment, where handle wafer is not used, at step 318, dry laser dicing rather than wet sawing is performed to singulate the MEMS wafer into die. At step 320, the stud bumps 20 are bonded to the CMOS substrate 12. It is noted that the steps 318 and 320 may be done in any order. Next, at step 322, thermal or thermo-sonic compression bonding is performed via the stud bumps 20 between the carrier substrate 22 and singulated die. Next, at step 324, underfill 24 is used to seal the MEMS substrate 14. It is noted that steps 322 and 324 may be reversed if the underfill is cured to a "B-stage" prior to the compression bond. Next, at step 326, the chip is flipped and the CMOS substrate 12 and back cavity 30 are covered with the cap layer 28. Alternatively, the step 326 follows the step 322 instead of the step 324. Following the step 326, at step 328, the chip is flipped and the solder balls 26 are formed on the carrier substrate 22.

Figure 4A:
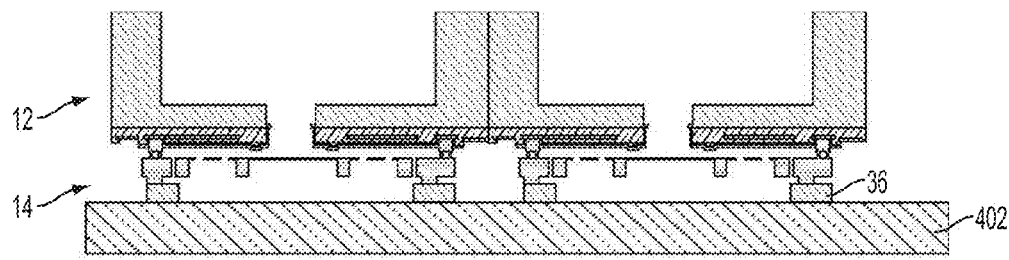
FIGS. 4(a) to 4(f) show the process (Method A) of fabricating the MEMS device 10, in accordance with the steps 306 to 316 of FIG. 3 where a handle wafer is employed.

FIGS. 4(a) to 4(f) show the process (Method A) of fabricating the MEMS device 10, in accordance with the steps 306 to 316 of FIG. 3 where a handle wafer is employed. In FIG. 4(a), the wafer is flipped and mounted on a tape 402.

Figure 4B:
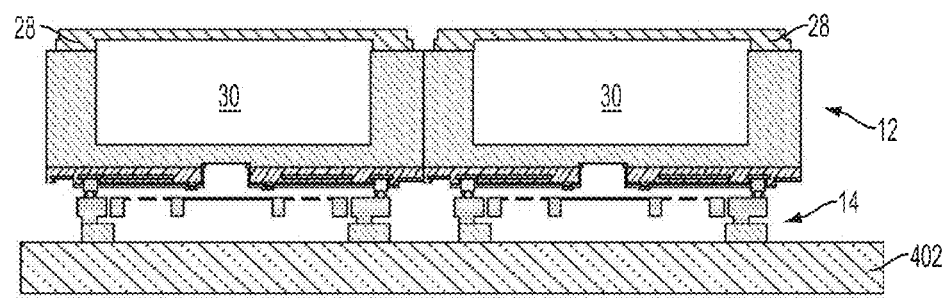

Next, as shown in FIG. 4(b), an adhesive is dispensed on top of the CMOS substrate 12, the cap layer 28 is mounted on top of the CMOS substrate 12 and the cavity 30, and the adhesive is cured on the wafer level. The cap layer 28 can be wafer-size or individually placed caps, as shown in FIG. 4(b). The shape of the cap layer 28 can be plate-shaped or u-shaped (indented) to further increase the back volume of the MEMS device 10. In an exemplary embodiment, the total volume of the back cavity 30 is approximately 0.3 to 4 mm$^3$. The electrical connection and bonding of the cap layer 28 to the CMOS substrate 12 can be formed by conductive epoxy compound or metal paste.

Figure 4C:
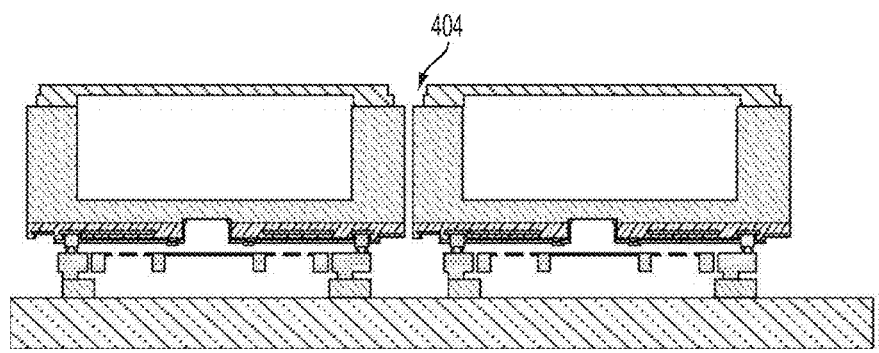

In FIG. 4(c), the wafer is diced as shown at 404 where the wafer is cut. Alternatively, the step of FIG. 4(c) is performed prior to the step of FIG. 4(b). As previously noted, wafer dicing can be cutting or laser dicing.

Figure 4D:
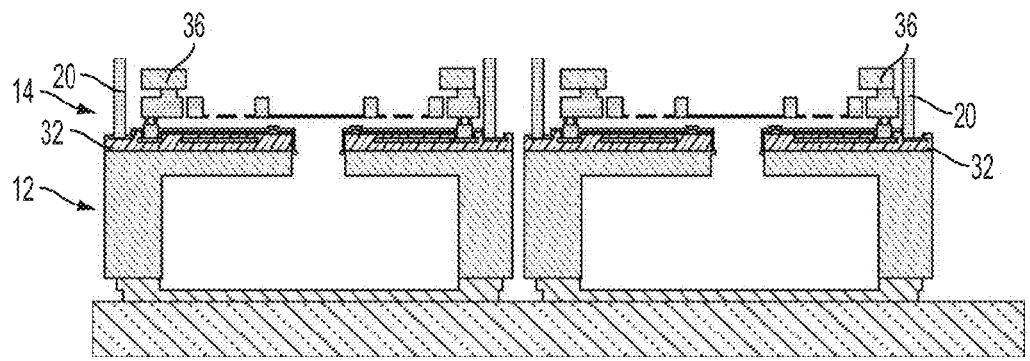

In FIG. 4(d), the wafer is flipped and transferred to another tape and the stud bonds 20 are placed on top of the metal pads 32. In an embodiment, the stud bonds 20 protrude above the top surface of the wafer handle 36. Alternatively, wafer dicing of step 4(c) can be done after the step of FIG. 4(d).

Figure 4E:
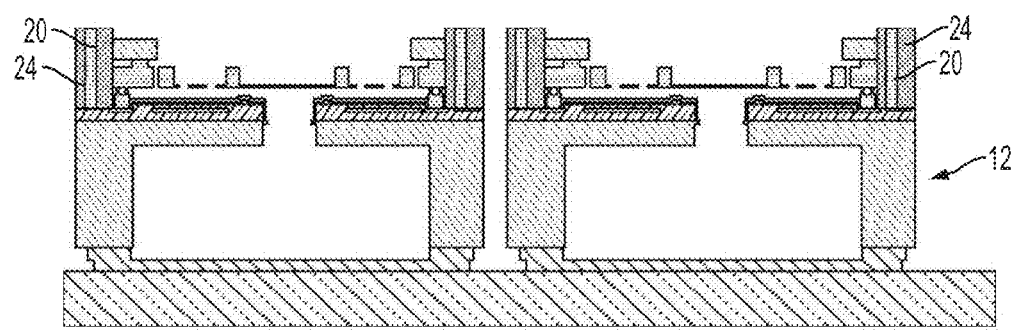

In FIG. 4(e), underfill 24 is optionally dispensed or screen printed on the stud bumps 20 to seal the MEMS substrate 14. The underfill 24 is alternatively dispensed or screen printed on the carrier substrate 22 and the edge of the die to seal the edge of the die, as shown in FIG. 4(e). Step 4(e) is optional.

Alternatively, the step of 4(c) is not performed until after the step of FIG. 4(e).

Figure 4F:
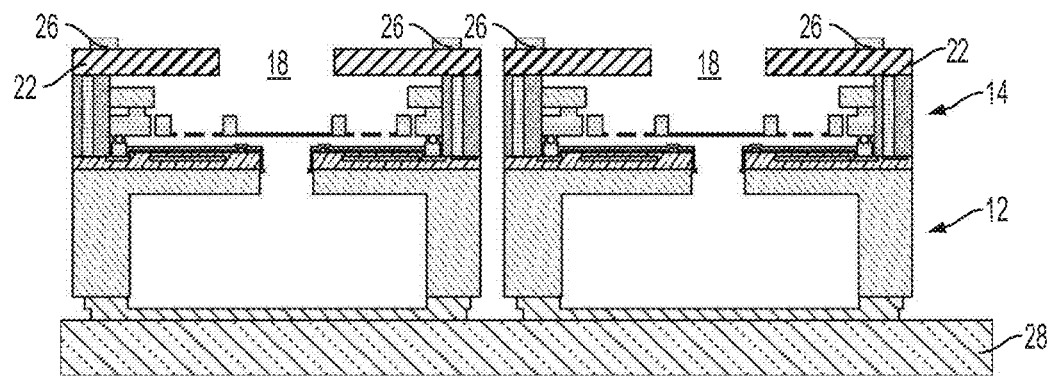

At the step of FIG. 4(f), the carrier substrate 22 with the port 18 is bonded to the stud bumps 20 using thermal or thermo-sonic compression bonding to connect signals. Thermal compression is performed with or without dispensing underfill, as the case may be. Further details of the various ways of fabricating the MEMS device 10 is also disclosed in U.S. patent application Ser. No. 13/950,178, filed by Kim, Brian et al, on Jul. 24, 2013, and entitled "Assembly and Package of MEMS Device", the disclosure of which is incorporated by reference. Solder balls 26 are deposited onto or bonded to the carrier substrate 22. The stud bumps 20 electrically connect the carrier substrate 22 to the CMOS substrate 12. The stud bumps 20 maybe comprise one or more stud bumps stacked on top of each other.

Alternatively, the carrier substrate 22 can be ceramic or a silicon interposer, and not epoxy-based.

Figure 5A:
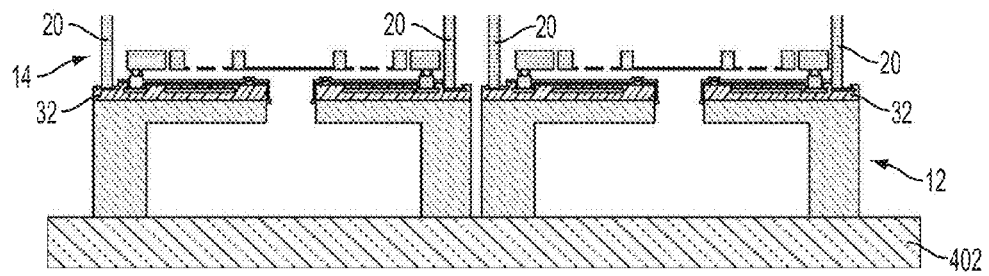
FIGS. 5(a) to 5(e) show the process (Method B) of fabricating the MEMS device 10, in accordance with the steps 318 to 328 of FIG. 3 where a handle wafer is not employed.

FIGS. 5(a) to 5(e) show the process (Method B) of fabricating the MEMS device 10, in accordance with the steps 318 to 328 of FIG. 3 where a handle wafer is not employed. In FIG. 5(a), laser dicing is employed to separate the dies and the stud bumps 20 are attached to the device. Alternatively, the stud bumps 20 are attached prior to laser dicing. The dies are optionally transferred to another tape after singulation to form the stud bumps on the metal pads. In an embodiment, the stud bumps protrude at least a few microns above the top surface of the MEMS substrate.

Figure 5B:
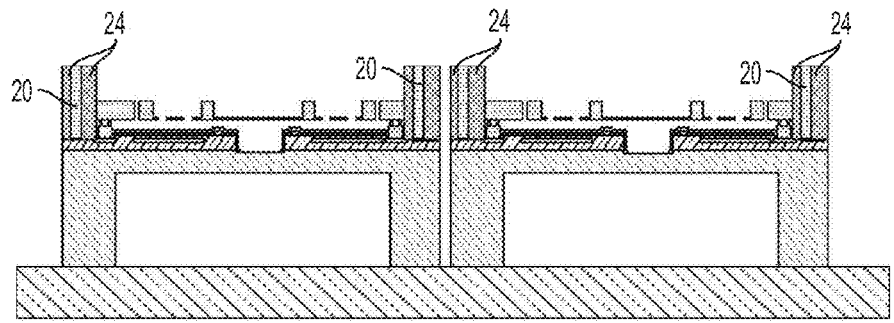
Figure 5C:
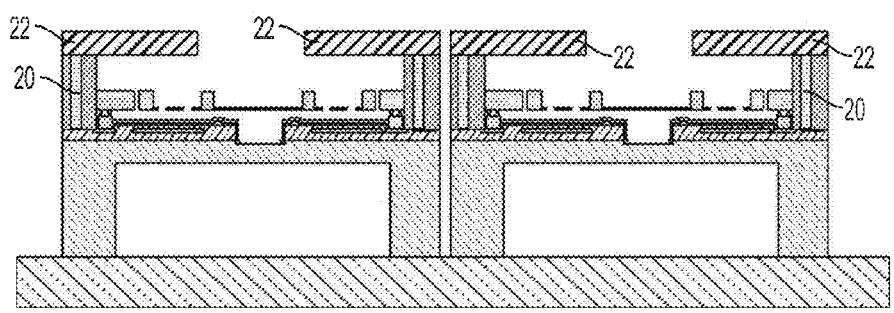
Figure 5D:
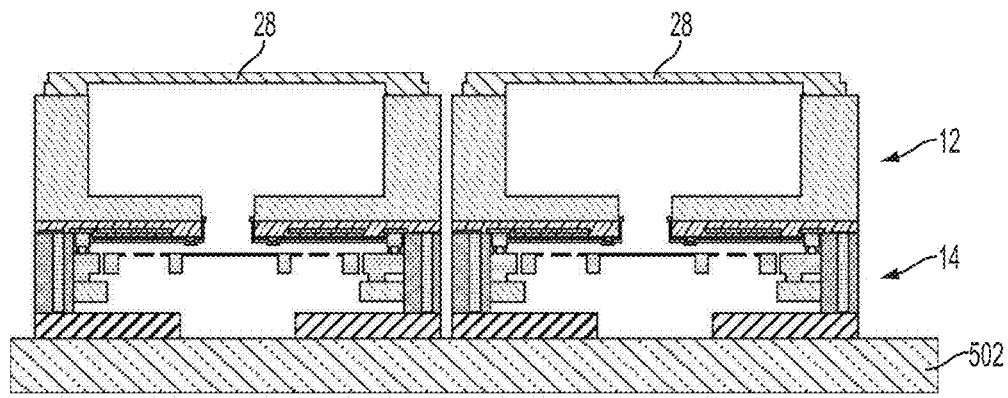
Figure 5E:
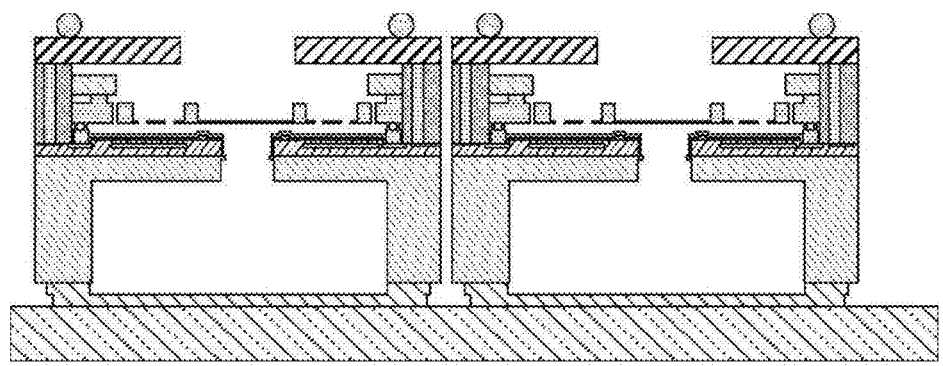

In FIG. 5(b) underfill 24 is dispensed or screen printed on the stud bumps 20 and the edge of the die to seal the package edge. Next, in FIG. 5(c), the carrier substrate 22 is bonded to the stud bumps 20 by thermal or thermo-sonic compression bonding. Alternatively, thermal or thermo-sonic compression in FIG. 5(c) is performed prior to the step shown in FIG. 5(b). The carrier substrate 22 may optionally have solder balls deposited onto its outside surface (the surface opposite that one which the stud bumps are formed). Next, die are picked up, flipped, and then mounted to a tape for CMOS back cavity capping. As shown in FIG. 5(d), the cap layer 28 is attached to the CMOS substrate using the same method as described relative to FIG. 4(b) of Method A. If the carrier substrate 22 requires additional solder balls, the dies are flipped and attached to another tape to deposit the solder balls onto the carrier substrate, as shown in FIG. 5(e).

Method B uses the CMOS substrate etches as additional volume of the back cavity 30, which desirably improves the performance of the microphone and reduces the total package height in embodiments utilizing the MEMS device 10 as a microphone. Additionally, this method solves the process capability issues of the TSV-based integrated back cavity and requires minimal change to the integrated MEMS and CMOS microphone process.

Figure 6A:
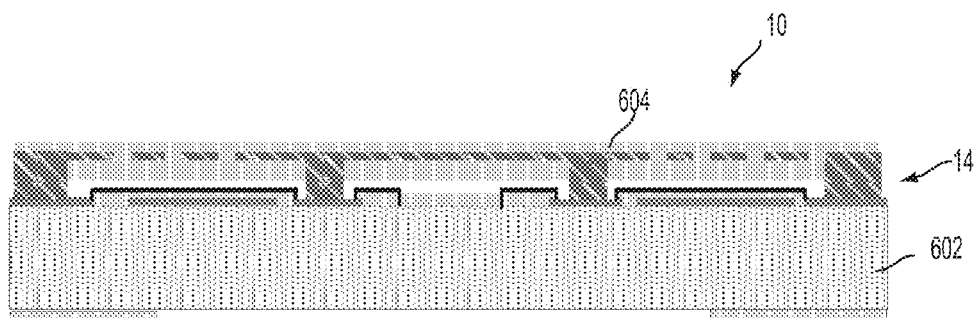
FIGS. 6(a)-(c) show a two-step cavity etch process, in accordance with a method of the invention.
Figure 6B:
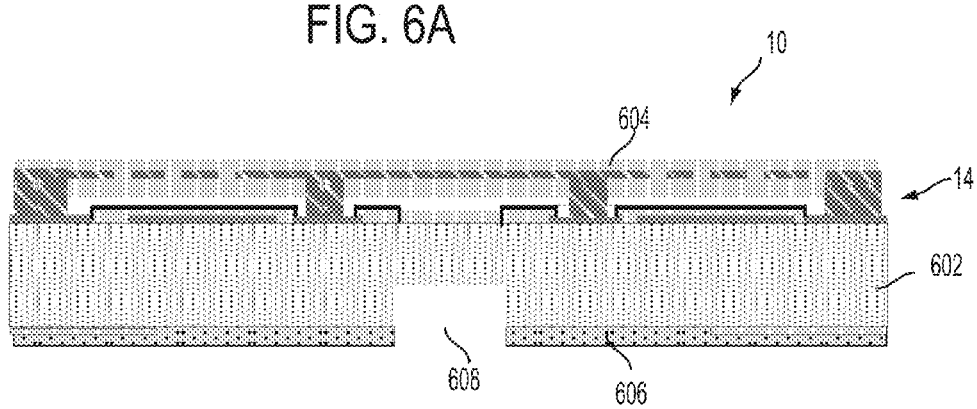
Figure 6C:
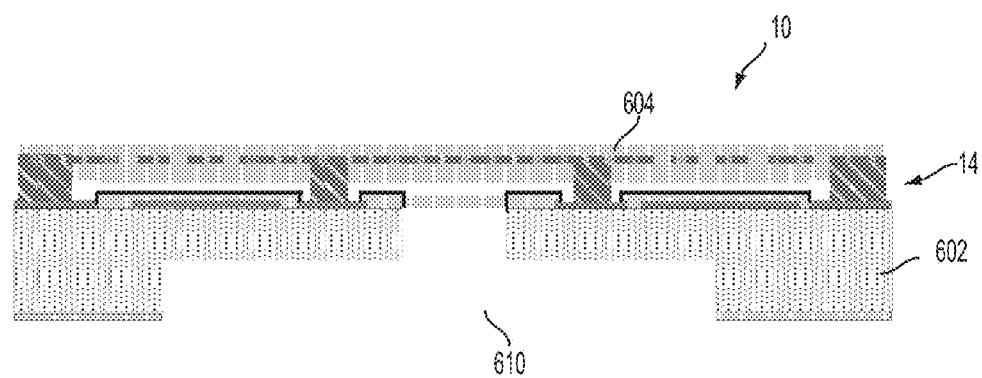

FIGS. 6(a)-(c) show a two-step cavity etch process, in accordance with a method of the invention. In FIG. 6(a), the MEMS device 10 is shown to include a protection or sacrificial layer 604 disposed in the MEMS substrate 14 and a hard mask 602 disposed in the CMOS substrate 12. In an embodiment of the invention, the sacrificial layer 604 is made of silicon oxide. After bonding the CMOS substrate 12 with the MEMS substrate 14, the hard mask 602, which is at the back of the CMOS substrate 12, is formed to define the back cavity (30) pattern. Subsequently, a photoresist mask 606 with a smaller opening 608 is shown formed in FIG. 6(b), defining the port opening pattern. The opening (or "cavity") 608 is shown partially etched using the photoresist mask 606, disposed on a bottom surface of the CMOS substrate 12. In FIG. 6(c), the photoresist mask 606 is removed and blanket etching is performed to form the larger cavity 610 and complete etching the opening 608. The blanket etching of FIG. 6(c) is stopped when opening 608 exposes the sacrificial layer 604. The partial etch depth of opening 608 in FIG. 6(b) in combination with the duration of the blanket etch of FIG. 6(c) determine the height "h" shown in FIG. 1. Accordingly, the back cavity 30 and the port 16 connecting the CMOS substrate 12 to the MEMS substrate 14 are formed. In FIG. 6(c), as stated above, the layer 604 is removed by etching to release the MEMS device 10.

Figure 7:
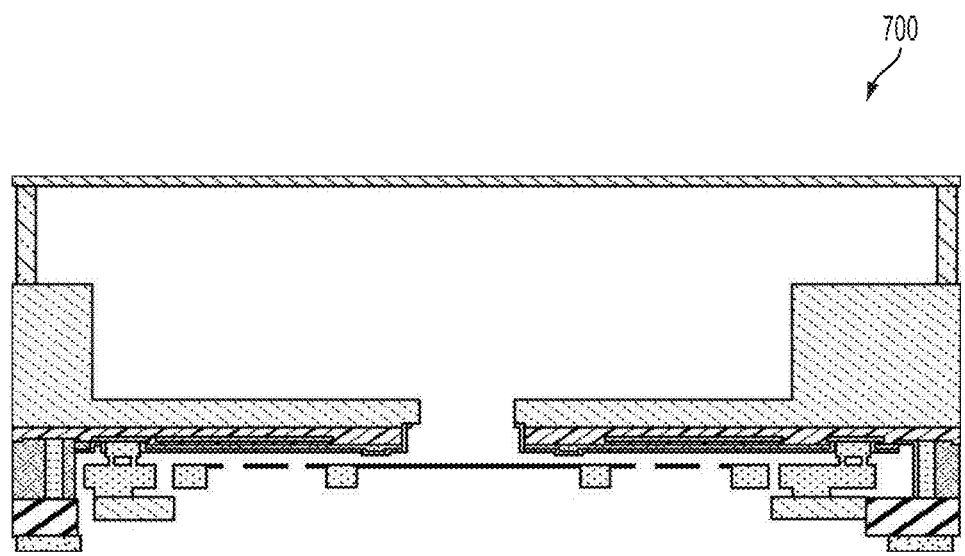
FIG. 7 shows a MEMS device 700, in accordance with another embodiment of the invention.

FIG. 7 shows a MEMS device 700, in accordance with another embodiment of the invention. In this embodiment, the indented cap layer 700 extends the height of back cavity 30 providing additional back cavity volume.

The MEMS device 10 can also have an inner seal ring, in accordance with yet another embodiment of the invention. The inner seal ring is acts as an acoustic seal when mounting the MEMS substrate 14 to a carrier substrate. Furthermore, the edges of the package device 10 may include a metal coating on the outer surface the package to form a Faraday cage for radio frequency (RF) shielding. The method of forming such a device is shown in FIGS. 8 and 9(a)-(i) to follow.

Figure 8:
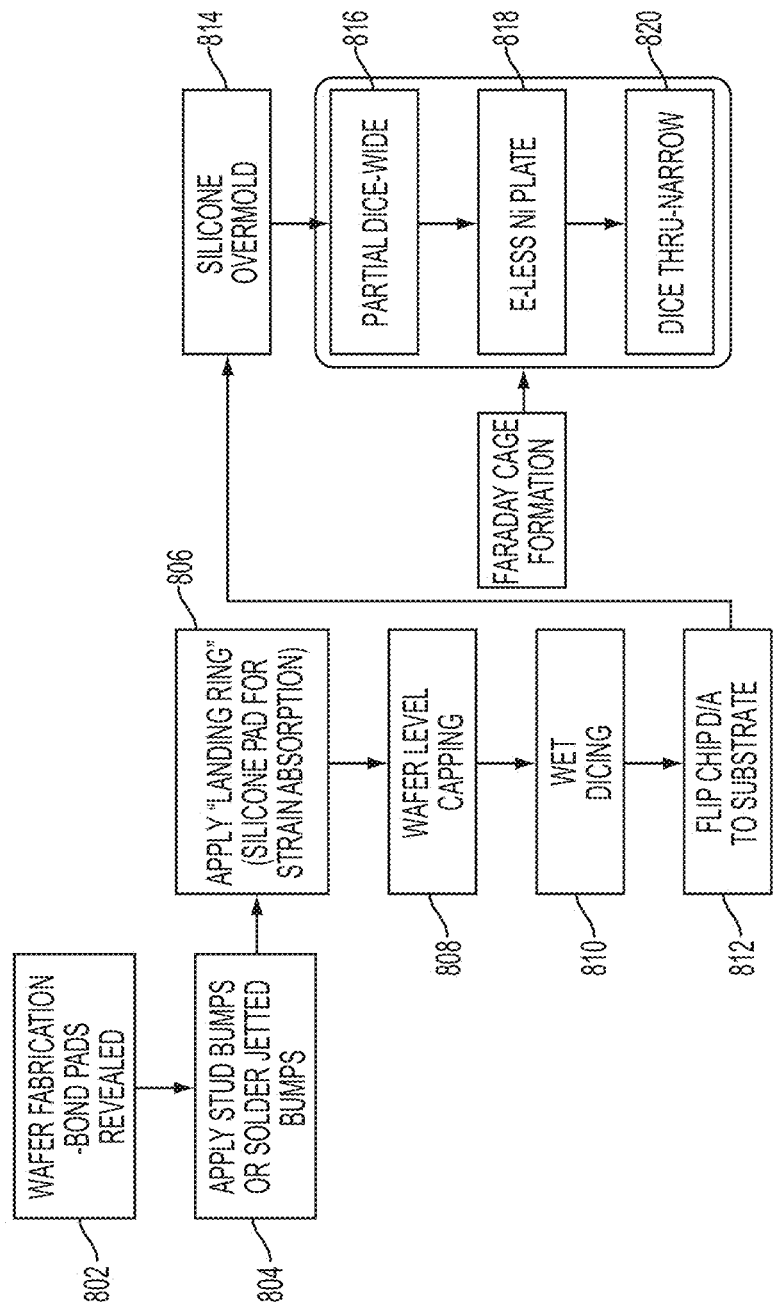
FIG. 8 is a flow chart of the steps performed in fabricating a MEMS device, in accordance with another method of the invention.

FIG. 8 is a flow chart of the steps performed in fabricating a MEMS device, in accordance with another method of the invention. At step 802, during wafer fabrication, bond pads are exposed. Next, at step 804, stud bumps or solder-jetted bumps are formed. Subsequently, at step 806, inner seal ring (or "landing ring") is applied for inner acoustic seal of the MEMS device and also to be used to absorb strain during packaging. The inner seal ring encircles the MEMS movable element and protrudes above the top surface of the stud bumps, in accordance with an embodiment of the invention. The inner seal ring, in an exemplary embodiment, is made of a polymer or silicone material with suitable elasticity and characteristic of suitable adhesion to the substrate.

Next, at step 808, the wafer is flipped and the capping layer 28 is applied to cap the back cavity 30 at the wafer level. Next, the wafer is diced, at step 810, to form singulated dies. After that, at step 812, the chip is flipped again and a carrier substrate is bonded by thermal or thermo-sonic compression bonding via the stud-bumps at the same time, or through subsequent curing, also creating a physical or adhesive bond via the inner seal ring. The electrical connection between the chip and the carrier substrate is provided via the stud bumps.

Next, at step 814, a silicone or molding material is filled in between dies. Subsequently, a wide curve saw dicing step is performed, at step 816, to cut through the molding material and partially into the substrate, followed by step 818, when a metal, such as nickel (Ni) or another type of metal layer coating is applied to form an RF shielding cage encapsulating the MEMS device. The metal coating is connected to ground or another defined potential via an electrical contact to the carrier substrate. Finally, at step 820, a narrow curve saw dicing step is performed to cut through the metal and substrate to form a final packaged device Steps 816 through 820 are required for Faraday cage formation.

Figure 9D:
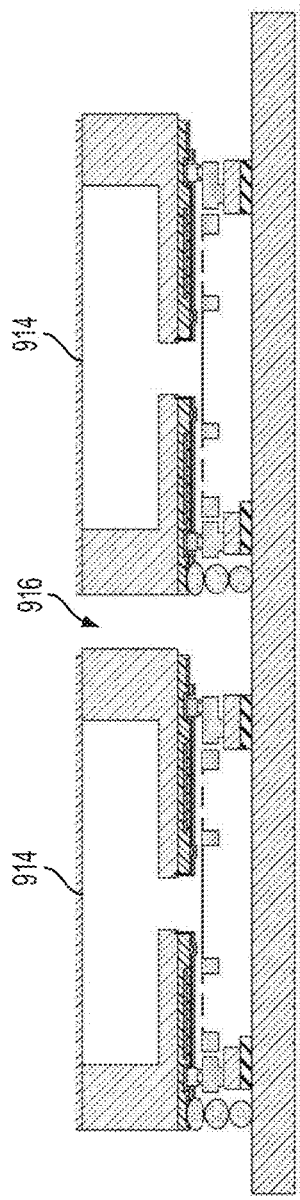
Figure 9E:
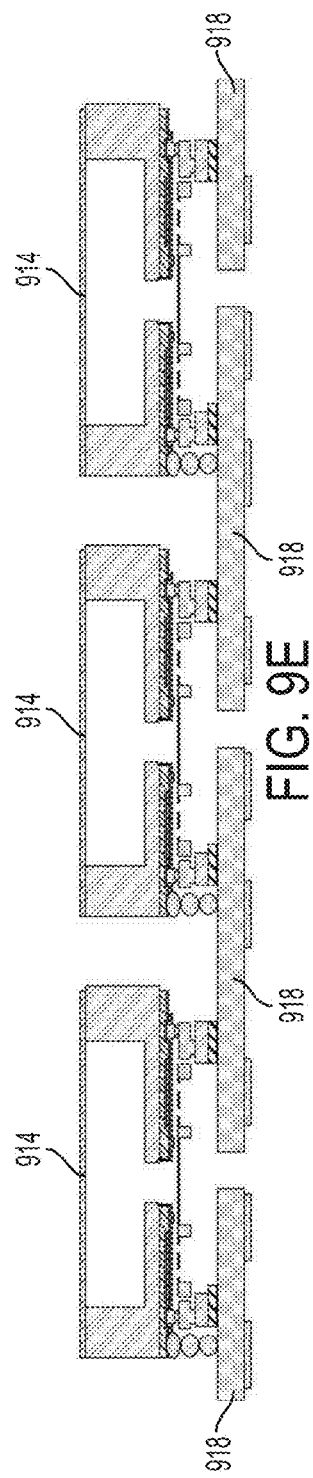
Figure 9F:
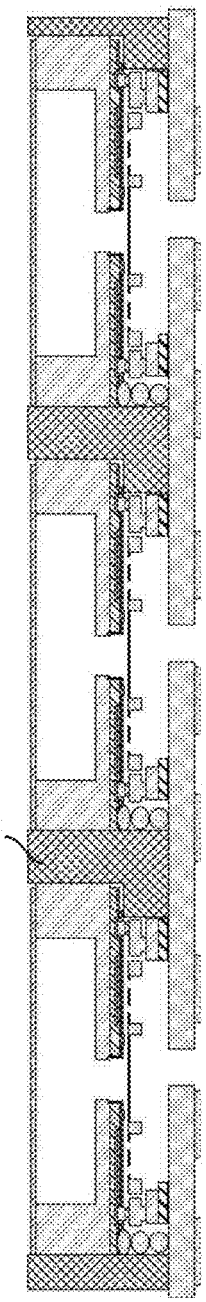
Figure 9G:
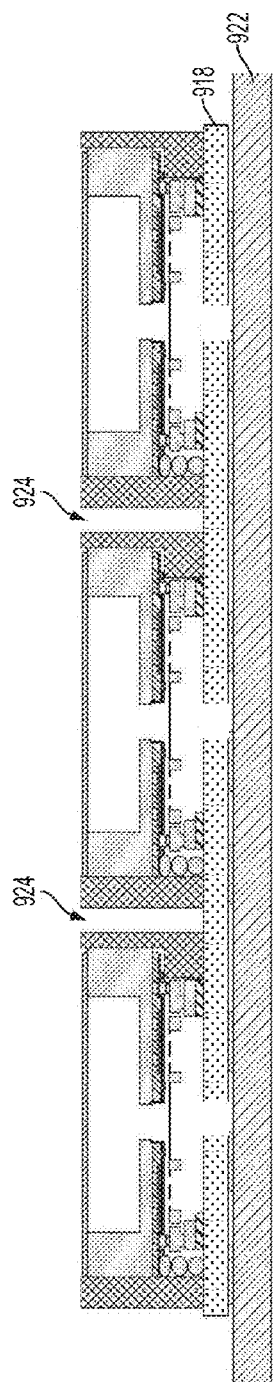
Figure 9H:
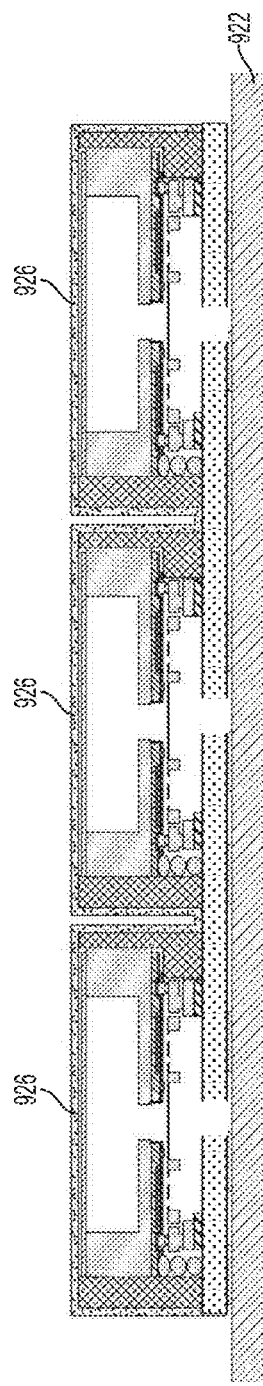
Figure 9I:
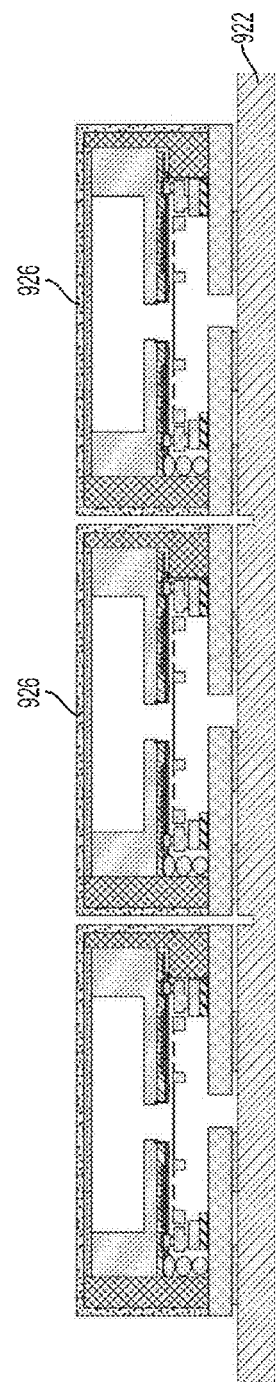

FIGS. 9(a)-9(j) show the manufacturing process, in accordance with the flow chart of FIG. 8, in fabricating a MEMS device with RF shielding and inner seal, in accordance with a method and embodiment of the invention. In FIG. 9(a), the MEMS device 900 is shown to include stud bumps 904 bonded to the substrate 910, which is held in place using the tape 902. The MEM substrate 908 is shown to be disposed on the CMOS substrate 910. Next, as shown in FIG. 9(b), an inner seal ring 912 is formed on top of the handle wafer 906. In an embodiment of the invention, the inner seal (or landing ring) is made of silicone.

Next, in FIG. 9(c), the wafer is capped with the capping layer 914 covering the substrate 910 and the cavity 913. At step 9(d), dicing is performed to cut the die, for example, as shown at 916. This is followed by flip chip bonding to a carrier substrate 918 at step 9(e). Next, at step 9(f), molding material 920 (e.g. silicone) is deposited, and at step 9(g), the carrier substrate 918 is held in place using another tape 922, while wide kerf dicing cuts 924 a performed. At step 9(h), a conductive material 926 (e.g. the nickel) is deposited via electro or electro less plating or an alternate metallization method. This is followed by singulation at step 9(i).

Figure 9J:
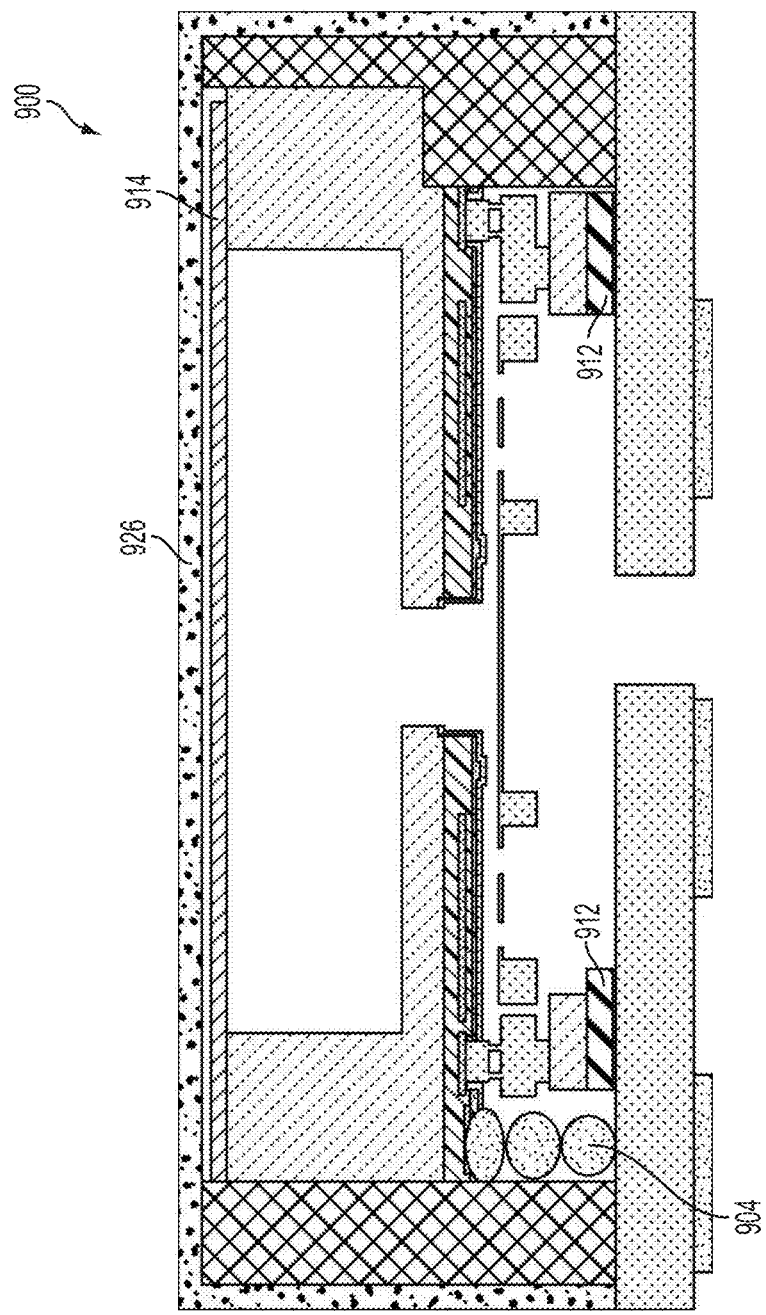

FIG. 9(j) shows the final form of the MEMS device 900, after the steps 9(a) through 9(i), in accordance with an embodiment of the invention.

FIG. 10 shows a MEMS device 1000, in accordance with another embodiment of the invention. The MEMS device 1000 is shown to have a MEMS acoustic element 1002 disposed on top of the CMOS substrate 1010 and more particularly, connected to a top metal layer 1006. The top metal layer 1006 is shown positioned on top of a lower metal layer 1004 and separated therefrom by dielectric 1012. In some embodiments, each of the top metal layer 1006 and the lower metal layer 1004 is made of multiple metal layers. Similarly, the dielectric 1012 is made of one or more dielectric layers. A port 1014 is shown through the CMOS substrate 1010 and under the MEMS acoustic element. A recess 1016 is shown formed under the MEMS acoustic element 1002 and surrounding the port 1014, formed by removal of one or more top metal and dielectric layers, such as the metal layer 1006. The CMOS circuits (semiconductor circuits) are shown located under the recess 1016. This approach maximizes the CMOS substrate area available for circuits, by minimizing the size of port 1014, while reducing damping under the acoustic element using recess 1016.

Although the description has been described with respect to particular embodiments thereof, these particular embodiments are merely illustrative, and not restrictive.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

The invention claimed is:

1. A MEMS device comprising:
a MEMS substrate including a movable element;
a CMOS substrate having a cavity, the MEMS substrate disposed on top of the CMOS substrate, wherein the MEMS substrate includes a handle wafer and at least one stud bump protrudes beyond a top surface of the handle wafer;
a cap layer disposed to cover the cavity, the cap layer being physically attached to the CMOS substrate; and
a back cavity connected to the CMOS substrate, the back cavity formed at least partially by the cavity in the CMOS substrate,
wherein the movable element is acoustically coupled to the back cavity.

2. The MEMS device, as recited in claim 1, wherein the MEMS substrate is electrically coupled to the CMOS substrate.

3. The MEMS device, as recited in claim 1, wherein the cap layer is made of conductive material.

4. The MEMS device, as recited in claim 1, wherein the cap layer is made of a non-conductive layer including conductive material.

5. The MEMS device, as recited in claim 1, wherein the cap layer is connected to the CMOS substrate by a conductive material.

6. The MEMS device, as recited in claim 1, wherein the CMOS substrate further comprises at least one bond pad and at least one stud bump, wherein the at least one stud bump is connected to the at least one bond pad.

7. The MEMS device, as recited in claim 1, wherein the stud bump is made of gold.

8. The MEMS device, as recited in claim 1, further including a silicone sealant disposed between the at least one stud bump and the MEMS substrate.

9. The MEMS device, as recited in claim 1, wherein the CMOS substrate is electrically connected to the at least one stud bump.

10. The MEMS device, as recited in claim 1, further including a carrier substrate bonded to at least one stud bump and further including solder metal disposed on top of the carrier substrate.

11. The MEMS device, as recited in claim 1, wherein the cap layer is substantially flat.

12. The MEMS device, as recited in claim 1, wherein the cap layer is indented.

13. The MEMS device, as recited in claim 6, further including a carrier substrate bonded to the at least one stud bump wherein the carrier substrate is a laminate.

14. The MEMS device, as recited in claim 1, further including an underfill disposed between the CMOS substrate and the carrier substrate.

15. The MEMS device, as recited in claim 14, wherein the underfill acoustically seals the carrier substrate and the MEMS substrate.

16. The MEMS device, as recited in claim 1, wherein the carrier substrate has an acoustic port.

17. The MEMS device, as recited in claim 1, wherein the MEMS device is encapsulated in a radio frequency (RF) shielding.

18. The MEMS device, as recited in claim 17, wherein the shielding is metal.

19. The MEMS device, as recited in claim 1, wherein the MEMS device is a microphone or ultrasonic transducer.

20. The MEMS device, as recited in claim 1, further including an inner acoustic seal ring enclosing the movable element.

21. A MEMS device comprising:
a MEMS substrate including a movable element;
a CMOS substrate having a port, the MEMS substrate disposed on top of the CMOS substrate, wherein the MEMS substrate includes a handle wafer and at least one stud bump protrudes beyond a top surface of the handle wafer;
a cap layer disposed to cover the cavity, the cap layer being physically attached to the CMOS substrate; and
a back cavity connected to the CMOS substrate, the back cavity formed at least partially by the port in the CMOS substrate,
wherein the movable element is acoustically coupled to the back cavity.

22. The MEMS device, as recited in claim 21, wherein the MEMS substrate is electrically coupled to the CMOS substrate.

23. The MEMS device, as recited in claim 21, further including a cap layer disposed to cover the port.

24. The MEMS device, as recited in claim 21, wherein the CMOS substrate further comprises at least one bond pad and at least one stud bump, wherein the at least one stud bump is connected to the at least one bond pad.

25. The MEMS device, as recited in claim 21, further including a silicone sealant disposed between the at least one stud bump and the MEMS substrate.

26. The MEMS device, as recited in claim 21, wherein the CMOS substrate is electrically connected to the at least one stud bump.

27. The MEMS device, as recited in claim 21, further including a carrier substrate bonded to the at least one stud bump and further including solder metal disposed on top of the carrier substrate.

* * * * *